United States Patent
Fujiwara et al.

(10) Patent No.: US 11,760,842 B2
(45) Date of Patent: Sep. 19, 2023

(54) COMPOSITION COMPRISING BLOCK COPOLYMER, AND METHOD FOR PRODUCING SILICEOUS FILM USING THE SAME

(71) Applicant: Merck Patent GmbH, Darmstadt (DE)

(72) Inventors: Takashi Fujiwara, Kakegawa (JP); Atsuhiko Sato, Kakegawa (JP)

(73) Assignee: MERCK PATENT GMBH, Darmstadt (DE)

( * ) Notice: Subject to any disclaimer, the term of this patent is extended or adjusted under 35 U.S.C. 154(b) by 146 days.

(21) Appl. No.: 17/602,416

(22) PCT Filed: Apr. 6, 2020

(86) PCT No.: PCT/EP2020/059723
§ 371 (c)(1),
(2) Date: Oct. 8, 2021

(87) PCT Pub. No.: WO2020/207950
PCT Pub. Date: Oct. 15, 2020

(65) Prior Publication Data
US 2022/0204704 A1 Jun. 30, 2022

(30) Foreign Application Priority Data
Apr. 8, 2019 (EP) .................................... 19167746

(51) Int. Cl.
| | |
|---|---|
| *C08G 77/60* | (2006.01) |
| *C08G 77/08* | (2006.01) |
| *C08G 77/24* | (2006.01) |
| *H01L 21/02* | (2006.01) |
| *C08G 81/00* | (2006.01) |

(52) U.S. Cl.
CPC ............. *C08G 77/60* (2013.01); *C08G 77/08* (2013.01); *C08G 77/24* (2013.01); *C08G 81/00* (2013.01); *H01L 21/02211* (2013.01); *H01L 21/02282* (2013.01); *C08G 2150/00* (2013.01)

(58) Field of Classification Search
CPC ............................... C08G 77/60; C08G 81/00
See application file for complete search history.

(56) References Cited

U.S. PATENT DOCUMENTS

| | | | | |
|---|---|---|---|---|
| 4,052,430 A | * | 10/1977 | Yajima | C08G 77/60 556/431 |
| 4,473,411 A | * | 9/1984 | Hook | C21D 8/0473 148/580 |
| 4,590,253 A | * | 5/1986 | Hasegawa | C08G 77/60 528/33 |
| 5,138,080 A | * | 8/1992 | Jung | C07F 9/08 528/34 |
| 5,602,060 A | | 2/1997 | Kobayashi et al. | |
| 7,125,514 B2 | * | 10/2006 | Okamura | D01F 9/10 264/638 |
| 8,466,076 B2 | | 6/2013 | Ruedinger et al. | |
| 2008/0268264 A1 | | 10/2008 | Akiyama et al. | |
| 2014/0138577 A1 | | 5/2014 | Katsoulis et al. | |

FOREIGN PATENT DOCUMENTS

| | | | |
|---|---|---|---|
| JP | 58-215426 | * | 12/1983 |
| JP | 2008-210929 A | | 9/2008 |
| JP | 2010-248299 A | | 11/2010 |
| WO | 2019/030206 | | 2/2019 |

OTHER PUBLICATIONS

International Search Report and Written Opinion received for PCT Patent Application No. PCT/EP2020/059723, dated Aug. 10, 2020, 9 pages.

* cited by examiner

*Primary Examiner* — Marc S Zimmer
(74) *Attorney, Agent, or Firm* — FAEGRE DRINKER BIDDLE & REATH LLP

(57) ABSTRACT

To provide a siliceous film manufacturing composition that can fill a narrow and a high aspect ratio trench and can produce a thick siliceous film. [Means for Solution] The present invention provides a siliceous film manufacturing composition that comprises, (a) a block copolymer having a linear and/or cyclic polysilane backbone block with or more silicon atoms and a polycarbosilane backbone block with or more silicon atoms, and (b) a solvent.

16 Claims, No Drawings

COMPOSITION COMPRISING BLOCK COPOLYMER, AND METHOD FOR PRODUCING SILICEOUS FILM USING THE SAME

CROSS-REFERENCE TO RELATED APPLICATIONS

This application is a national stage application (under 35 U.S.C. § 371) of PCT/EP2020/059723, filed Apr. 6, 2020, which claims benefit of European Application No. 19167746.7, filed Apr. 8, 2019, both of which are incorporated herein by reference in their entirety.

BACKGROUND OF THE INVENTION

Technical Field

The present invention relates to a composition for producing a siliceous film, comprising a block copolymer having a polysilane backbone block and a polycarbosilane backbone block. Further, the present invention also relates to a method for forming a siliceous film using the same.

Background Art

In manufacture of electronic devices, especially semiconductor devices, an interlayer insulating film is formed between a transistor element and a bit line, between a bit line and a capacitor, between a capacitor and a metal wiring, between plural metal wirings, and the like. Further, an insulating material is filled in isolation trenches provided on a substrate surface or the like. Furthermore, after forming a semiconductor element on a substrate surface, a coating layer is formed using a sealing material to provide a package. Such an interlayer insulating film and coating layer are often formed of a siliceous material.

A chemical vapor deposition method (CVD method), a sol-gel method, a method for applying a composition comprising a silicon-containing polymer and baking, and the like are used for a method for forming a siliceous film. Among these, the method for forming a siliceous film using a composition is often employed since it is relatively simple. To form a siliceous film, a composition comprising a silicon-containing polymer such as polysilazane, polysiloxane, polysiloxazane or polysilane is applied on a surface of a substrate or the like and baked to oxidize the silicon contained in the polymer to form a siliceous film.

It has been required for a material which can fill a narrow and a high aspect ratio trench of a semiconductor device and can be converted into a high-density film by curing. Furthermore, a thicker siliceous film than before is eagerly required due to a development of 3D NAND technology.

U.S. Pat. No. 5,602,060 disclosed a process for the production of semiconductor devices comprising the steps of applying a solution of a polycarbosilane in a solvent onto a substrate and curing the polycarbosilane layer in an oxidizing atmosphere to convert to a silicon oxide layer.

Japanese Patent Laid-Open No. 2008-210929 disclosed a method for solidifying a polycarbosilane layer under an atmosphere of oxygen partial pressure of 50-3,000 ppm, wherein at least one of the methods selected from the group consisting of heat-treatment, ultraviolet irradiation, and electron beam irradiation.

Method of synthesis of a polysilane/polycarbosilane copolymer was known from U.S. Pat. No. 8,466,076.

PRIOR ART DOCUMENTS

Patent Documents

Patent Document 1: U.S. Pat. No. 5,602,060
Patent Document 2: Japanese Patent Laid-Open No. 2008-210929
Patent Document 3: U.S. Pat. No. 8,466,076

SUMMARY OF THE INVENTION

One embodiment of the present invention provides a siliceous film manufacturing composition that can fill a narrow and a high aspect ratio trench and can produce a thick siliceous film.

Another embodiment of the present invention provides a method of manufacturing a siliceous film having excellent electrical properties.

Yet another embodiment of the present invention provides a method of manufacturing an electronic device having a siliceous film with excellent electrical properties.

One embodiment of the present invention provides a siliceous film manufacturing composition that comprises, (a) a block copolymer having a linear and/or cyclic polysilane backbone block with 5 or more silicon atoms (hereinafter refers to as "Block A") and a polycarbosilane backbone block with 15 or more silicon atoms (hereinafter refers to as "Block B"), wherein at least one silicon atom of Block A is bound to at least one silicon atom of Block B with a single bond and/or a cross-linker containing silicon atom, and (b) a solvent.

Block A comprises 5 or more repeating units selected from at least one of the groups consisting of units represented by the general formulae (I-1) to (I-3):

(I-1)

(I-2)

(I-3)

wherein $R^{Ia}$, $R^{Ib}$ and $R^{Ic}$ are each independently hydrogen, halogen, $C_1$-$C_6$ alkyl, or $C_6$-$C_{10}$ aryl.

Block B comprises 15 or more repeating units selected from at least one of the groups consisting of units repre-sented by the general formulae (II-1) to (II-4):

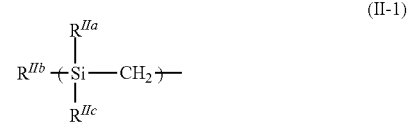

(II-1)

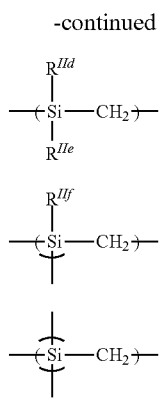

wherein $R^{IIa}$-$R^{IIf}$ are each independently hydrogen, $C_1$-$C_6$ alkyl, or $C_6$-$C_{10}$ aryl.

The block copolymer has a mass average molecular weight of 1,200 to 25,000.

The solvent has a relative dielectric constant of 3.0 or less.

Another embodiment of the present invention provides a method of manufacturing a siliceous film that includes applying the above-described siliceous film manufacturing composition on a substrate to form a coating; curing the coating under an oxygen partial pressure of 20-101 kPa and/or water vapor partial pressure of 0.5-101 kPa at 200-1000° C.

Yet another embodiment of the present invention provides a method of manufacturing an electronic device having a siliceous film manufactured by a method comprising; applying the above-described siliceous film manufacturing composition on a substrate to form a coating; curing the coating under an oxidizing atmosphere.

The siliceous film manufacturing composition of the present invention is possible to fill a narrow and a high aspect ratio trench. Further, the resultant siliceous film also has features that its shrinkage during curing is small and that its electrical properties is excellent. It is possible to improve the yield of electronic devices by using this composition.

Definitions

Unless otherwise stated, the following terms used in the specification and claims shall have the following meanings for the purpose of the present specification.

In the present specification, the use of the singular includes the plural, and the words "a", "an" and "the" mean "at least one", unless specifically stated otherwise. Furthermore, the use of the term "including", as well as other forms such as "includes" and "included", is not limiting. Also, terms such as "element" or "component" encompass both elements or components comprising one unit and elements or components that comprise more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measurable numerical variable, refers to the indicated value of the variable and to all values of the variable that are within the experimental error of the indicated value (e.g., within the 95% confidence limit for the mean) or within ±10 percent of the indicated value, whichever is greater.

In the present specification, the descriptions such as "$C_{x\text{-}y}$", "$C_x$-$C_y$" and "$C_x$" mean the number of carbon atoms in a molecule or substituent. For example, $C_{1\text{-}6}$ alkyl means alkyl having not less than 1 and not more than 6 carbons (methyl, ethyl, propyl, butyl, pentyl, hexyl etc.).

In the present specification, unless otherwise specifically mentioned, "alkyl" means a linear or branched alkyl, and "cycloalkyl" means alkyl containing a cyclic structure. Those in which a cyclic structure is substituted with a linear or branched alkyl are also referred to as cycloalkyl. Further, those having a polycyclic structure such as bicycloalkyl are also included in cycloalkyl. "Heteroalkyl" means alkyl containing oxygen or nitrogen in the main chain or side chain unless otherwise specifically mentioned and means, for example, alkyl including oxy, hydroxy, amino, carbonyl and the like. Further, "hydrocarbyl group" means a monovalent, divalent or higher group comprising carbon and hydrogen and optionally containing oxygen or nitrogen. Furthermore, in the present specification, unless otherwise specifically mentioned, "alkylene" means a divalent group corresponding to said alkyl and includes, for example, a linear alkylene or a branched alkylene having a side chain.

In the case of numerical range is described with "to", "–" or "~", these include end points and units are common. For example, 5-25 mol % refers to that 5 mol % or more and 25 mol % or less.

In the present specification, in the case polymer comprises plural kinds of repeating units without any specific definitions, these repeating units copolymerize. These copolymerizations can take alternating copolymerization, random copolymerization, block copolymerization, graft copolymerization, or any mixture of thereof.

In the present specification, unless otherwise specifically mentioned, Celsius is used as the temperature unit. For example, 20 degrees means 20 degrees Celsius.

In the present specification, unless otherwise specifically mentioned, "%" means "% by mass" and "parts" means "parts by mass".

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literatures and similar materials defines a term in a manner that contradicts the definition of that term in this application, this application controls.

DETAILED DESCRIPTION OF THE INVENTION

Embodiments of the present invention are described below in detail.
[Siliceous Film Manufacturing Composition]

The siliceous film manufacturing composition of the present invention comprises (a) a specific block copolymer and (b) a solvent.

(a) Block Copolymer

The block copolymer of the present invention comprises: a linear and/or cyclic polysilane backbone Block A comprising 5 or more silicon atom and a polycarbosilane backbone Block B comprising 15 or more silicon atom, wherein at least one silicon atom of Block A is bound to at least one silicon atom of Block B with a single bond and/or a cross-linker containing silicon atom.

In the present invention, the block copolymer with different structure of Block A or Block B can be used, in the case the block copolymer comprises multiple blocks. Block A and Block B in the block copolymer can be bound randomly or alternatively. Block A and Block B can be bound as a graft copolymer in which Block A as a side chain binds to Block B as a backbone. In a molecule of the block copolymer, Block A can be bound to Block B or another Block A, or Block B can be bound to another Block B.

In the present invention, a polysilane backbone means a backbone consisting of Si—Si bond and a polycarbosilane backbone means a backbone composed of repeating units of Si—C bond.

Preferably, Block A comprises 5 or more repeating units selected from at least one of the groups consisting of units represented by the general formulae (I-1) to (I-3):

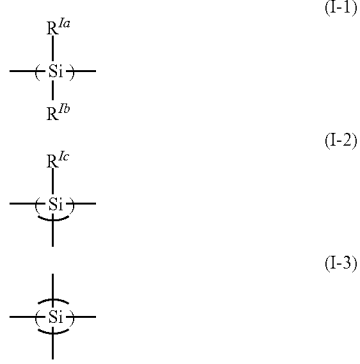

(I-1)

(I-2)

(I-3)

wherein $R^{Ia}$, $R^{Ib}$ and $R^{Ic}$ are each independently hydrogen, halogen, $C_1$-$C_6$ alkyl, or $C_6$-$C_{10}$ aryl, and Block B comprises 15 or more repeating units selected from at least one of the groups consisting of units represented by the general formulae (II-1) to (II-4):

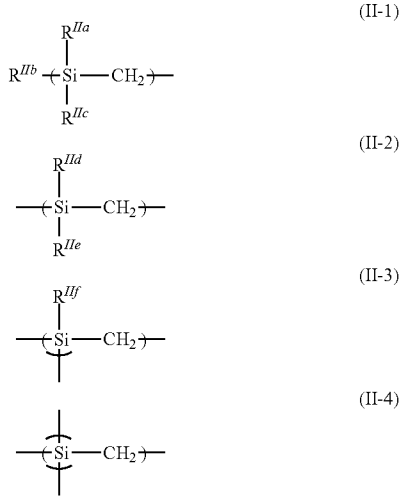

(II-1)

(II-2)

(II-3)

(II-4)

wherein $R^{IIa}$-$R^{IIf}$ are each independently hydrogen, $C_1$-$C_6$ alkyl, or $C_6$-$C_{10}$ aryl.

Examples of $R^{Ia}$, $R^{Ib}$ and $R^{Ic}$ in Block A include, but not limited to, hydrogen, methyl, ethyl, n-propyl, isopropyl, n-butyl, isobutyl, phenyl, tolyl, xylyl. Preferably, $R^{Ia}$, $R^{Ib}$ and $R^{Ic}$ are all hydrogen.

Combination of repeating units (I-1) to (I-3) is not limited but it is preferable to include at least one unit of (I-2) or (I-3). Number of Block A in one block copolymer is preferably 1-95, more preferably 3-90.

As far as Block A is a linear polysilane backbone, number of comprising units (I-1) to (I-3) of one Block A is preferably 5-20, more preferably 5-15. Comprising units are preferably bound each other to form Si—Si bond.

Preferably, at least one of Block A is represented by the general formula (I-4):

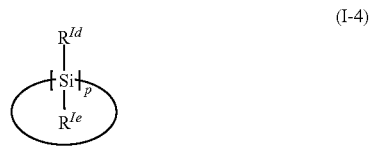

(I-4)

wherein $R^{Id}$ and $R^{Ie}$ are each independently hydrogen, halogen, $C_1$-$C_6$ alkyl, $C_6$-$C_{10}$ aryl, or a single bond, provided that at least one of $R^{Id}$ or $R^{Ie}$ is a single bond, p is an integer of 5 or more. Preferably, p is 5 or 6. The single bond described above is preferably bound to another Block A or Block B. Preferably, at least one of $R^{Id}$ or $R^{Ie}$ is a single bond and all the others are hydrogen.

Examples of $R^{IIa}$-$R^{IIf}$ in Block B include, but not limited to, hydrogen, methyl, ethyl, n-propyl, isopropyl, n-butyl, isobutyl. Preferably, all of $R^{IIa}$-$R^{IIf}$ are hydrogen.

Combination of repeating units (II-1) to (II-4) is not limited but it is preferable to include at least one unit of (II-3) or (II-4). Number of repeating units of one Block B is 15 or more, preferably 15-250, more preferably 15-130. Repeating units (II-1) to (II-4) are preferably bound each other. Number of Block B in one block copolymer molecule is preferably 1-24, more preferably 1-6.

In the present invention, the block copolymer further comprises a cross-linker containing silicon atom, preferably, to crosslink Block A each other, Block B each other, or between Block A and Block B. Example of the cross-linker containing silicon atom includes, but not limited to, —$Si_2R_4$—, wherein R is independently hydrogen, halogen, alkyl or alkoxy, preferably hydrogen or $C_1$ alkyl or alkoxy.

Combination of Block A and Block B is not limited but a ratio of total number of repeating units of formulae (I-1) to (I-3) to that of repeating units of formulae (II-1) to (II-4) (hereinafter refers to as "repeating unit ratio") is preferably 20-230%, more preferably 20-200%.

The repeating unit ratio can be calculated from an integral of $^{29}$Si-NMR spectrum obtained from Inverse Gate Decoupling Method. The repeating unit ratio is a ratio of an integral of −115 to −95 ppm, which is assigned to silicon of polysilicon backbone, to an integral of −40 to 20 ppm, which is assigned to silicon of polycarbosilane backbone.

Measurement of $^{29}$Si-NMR can be conducted as the following. Solvent of a block copolymer solution is removed by a rotary evaporator. 0.4 g of the block copolymer is dissolved in 1.2 g of a deuterated solvent such as deuterated chloroform. The sample solution is measured 1,000 times by JNM-ECS400 (JEOL Ltd.) to obtain $^{29}$Si-NMR spectrum.

From the requirement for solvent solubility of the block copolymer, planarity of the block copolymer film, and adhesion of the block copolymer film to a substrate, the mass average molecular weight of the block copolymer according to the present invention is preferably 1,100-25,000, more preferably 2,000-20,000 and most preferably 2,500-10,000. The mass average molecular weight in terms of polystyrene can be measured by the gel permeation chromatography based on polystyrene standard.

A method for manufacturing the block copolymer of the present invention is not specifically limited but comprising:
(A) a photoirradiation step to a cyclic polysilane having 5 or more silicon atoms,
(B) a preparation step of a mixture comprising of the photoirradiated cyclic polysilane having 5 or more silicon atoms and a polycarbosilane having 15 or more silicon atoms, and
(C) a photoirradiation step to said mixture.

A method for manufacturing the block copolymer of the present invention is exemplified below step by step.
(A) Photoirradiation step to a cyclic polysilane having 5 or more silicon atoms A cyclic polysilane using in the present manufacturing method can be freely selected as far as it does not impair the effect of the present invention. Such a cyclic polysilane can be either an inorganic material or an organic material and is that comprising a linear structure, a branched structure or a partially cyclic structure in a molecule.

Preferably, the cyclic polysilane is represented by the following formula (I-5):

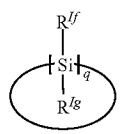

(I-5)

wherein $R^{If}$ and $R^{Ig}$ are each independently hydrogen, halogen, $C_1$-$C_6$ alkyl, or $C_6$-$C_{10}$ aryl, q is an integer of 5 or more. Preferably, q is 5-8 and more preferably 5 or 6.

Preferable examples of cyclic polysilanes include, silylcyclopentasilane, silylcyclohexasilane, disilylcyclohexasilane, cyclopentasilane and cyclohexasilane, more preferably cyclopentasilane or cyclohexasilane.

Preferable irradiation wavelength of step (A) is at least including wavelength of 172-405 nm, more preferably 282-405 nm. Irradiation intensity is preferably 10-250 mW/cm$^2$, more preferably 50-150 mW/cm$^2$. Irradiation time is preferably 30-300 seconds, more preferably 50-200 seconds. Cyclopentasilane or cyclohexasilane can be irradiated while stirring due to its liquid phase at room temperature. In case of a solid cyclic polysilane, it can be dissolved in an appropriate solvent and the solution can be irradiated while stirring. Whole or part of the ring of a cyclic polysilane would open during the photoirradiation step.
(B) Preparation step of a mixture comprising of the photoirradiated cyclic polysilane having 5 or more silicon atoms and a polycarbosilane having 15 or more silicon atoms A mixture comprising of the photoirradiated cyclic polysilane in step (A) having 5 or more silicon atoms and a polycarbosilane having 15 or more silicon atoms is prepared in this step. It is preferable that the mixture further comprises a cross-linker containing silicon atom.

A polycarbosilane using in the present manufacturing method can be freely selected as far as it does not impair the effect of the present invention. Such a polycarbosilane can be either an inorganic material or an organic material and is that comprising a linear structure, a branched structure or a partially cyclic structure in a molecule.

Preferably, the polycarbosilane comprises 15 or more repeating units selected from at least one of the groups consisting of units represented by the following formulae (II-1) to (II-4):

(II-1)

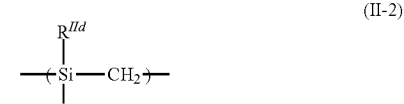

(II-2)

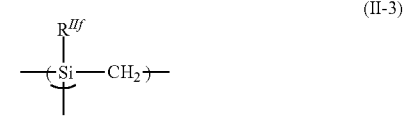

(II-3)

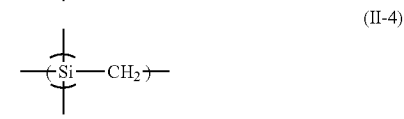

(II-4)

wherein $R^{IIa}$-$R^{IIf}$ are each independently hydrogen, $C_1$-$C_6$ alkyl, or $C_6$-$C_{10}$ aryl.

More preferably, a polycarbosilane using in the present manufacturing method is poly(perhydrocarbosilane) (hereinafter referred to as "PHPC"). PHPC is a silicon containing polymer consisting of Si, C and H having repeating unit of Si—C bond. PHPC is composed of Si and C bonding to H except for Si—C bond. PHPC is not including other elements such as O and N, substantially.

In the present invention, PHPC with a linear structure, a branched structure or a partially cyclic structure in a molecule can be used. Example of PHPC comprises repeating units represented by the following formulae (II-b)-(II-d) and terminating unit represented by the following formula (II-a):

(II-a)

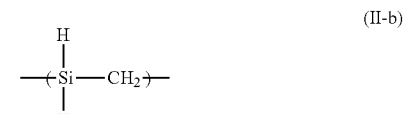

(II-b)

(II-c)

(II-d)

From the requirement for solvent solubility of a polycarbosilane, the mass average molecular weight of the polycarbosilane using in the present manufacturing method is preferably 800-15,000, more preferably 800-10,000 and most preferably 800-8,000. The mass average molecular weight in terms of polystyrene can be measured by the gel permeation chromatography based on polystyrene standard.

A cross-linker using in the present manufacturing method comprises silicon atom. The cross-linker is not specifically limited and it includes, for example, halogenated silane compounds such as hexachlorodisilane, 1,1,2,2-tetrachloro-1,2-dimethyldisilane, 1,2-dichlorodisilane, 1,1-dichlorodisilane, 1,2-dichlorotetramethyldisilane, octachlorotrisilane, 1,1,1,3,3,3-hexachloro-2,2-dimethyltrisilane, dichlorosilane, dichloromethylsilane, dichlorodimethylsilane, trichlorosilane, methyltrichlorosilane, hexachlorodisilazane, tetrachlorodisilazane, hexachlorodisiloxane, 1,1,3,3,-tetrachloro-1,3-dimethyldisiloxane, 1,3-dichloro-1,1,3,3-tetramethyldisiloxane, 1,3-dichlorodisiloxane, bis(trichlorosilyl)acetylene, 1,2-bis(trichlorosilyl)ethene, 1,2-bis(dichloromethylsilyl)ethene, and the like; alkoxysilanes such as trimethoxysilane, methyltrimethoxysilane, dimethoxymethylsilane, dimethoxydimethylsilane, triethoxysilane, diethoxysilane, diethoxymethylsilane, diethoxydimethylsilane, and the like. The cross-linker crosslinks polysilane and polycarbosilane, polysilane each other, or polycarbosilane each other. A cross-linked block copolymer by the cross-linker suppresses phase separation of Block A and Block B during a film formation process and enables to form a uniform film.

The mass average molecular weight of the cross-linker using in the manufacturing method of the present invention is preferably 100-350, more preferably 125-270.

(C) Photoirradiation Step to Said Mixture

A condensation reaction between Block A and Block B is considered to take place during the photoirradiation step. Preferable irradiation wavelength of step (C) is at least including a wavelength of 172-405 nm, more preferably 282-405 nm. Irradiation intensity is preferably 10-250 mW/cm$^2$, more preferably 50-150 mW/cm$^2$. Irradiation time is preferably 5-100 minutes, more preferably 5-60 minutes. Irradiation energy is preferably 3-1,500 J, more preferably 25-500 J. The described steps (A)-(C) are preferable to be conducted under an inert atmosphere.

After the step (C), the product is dissolved in a solvent such as cyclooctane and the like. The solution is filtered to remove by-products to obtain the block copolymer of the present invention. The product is a block copolymer having two kinds of block structures.

(b) Solvent

The siliceous film manufacturing composition of the present invention comprises the described block copolymer and a solvent. The solvent is not specifically limited as far as it is capable to dissolve the components, and it includes, for example, ethylene glycol monoalkylethers such as ethylene glycol monomethylether, ethylene glycol monoethylether, ethylene glycol monopropylether and ethylene glycol monobutylether; diethylene glycol dialkylethers such as diethylene glycol dimethylether, diethylene glycol diethylether, diethylene glycol dipropylether and diethylene glycol dibutylether; ethylene glycol alkylether acetates such as methyl cellosolve acetate and ethyl cellosolve acetate; propylene glycol monoalkylethers such as propylene glycol monomethylether and propylene glycol monoethylether; propylene glycol monoalkylether acetates such as propylene glycol monomethylether acetate, propylene glycol monoethylether acetate and propylene glycol monopropylether acetate; aromatic compounds such as benzene, toluene, xylene, ethylbenzene, diethylbenzene, mesitylene and triethylbenzene; saturated hydrocarbons such as n-pentane, i-pentane, n-hexane, i-hexane, n-heptane, i-heptane, n-octane, i-octane, n-nonane, i-nonane, n-decane and i-decane; alicyclic hydrocarbons such as cyclohexane, methylcyclohexane, ethylcyclohexane, cycloheptane, cyclooctane, decahydronaphthalene and p-menthane; unsaturated hydrocarbons such as cyclohexene and dipentene; ethers such as dipropyl ether, dibutyl ether and anisole. Preferable solvents are cyclooctane, decahydronaphthalene, toluene and mesitylene. Solvent can be used solely or in combination of two or more.

A relative dielectric constant of the solvent is preferably 3.0 or less, more preferably 2.5 or less to dissolve the block copolymer homogeneously.

Solvent content of the siliceous film manufacturing composition depends on coating methods and film thickness of the coating. Except for solvent, solid content of the composition is preferably 1-96 mass %, more preferably 2-60 mass % based on the total mass of the composition.

Component (a) and (b) are essential for the siliceous film manufacturing composition, but the composition can comprise other components optionally. The other components are described below. Solid content of the other components, except for (a) and (b), is preferably 10 mass % or less, more preferably 5 mass % or less based on the total mass of the composition.

(c) Other Components

Other optional components are, for example, surfactants and the like.

Since the surfactant can improve coatability, it is preferable to be used. Examples of the surfactant that can be used in the siliceous film manufacturing composition of the present invention include nonionic surfactants, anionic surfactants, amphoteric surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxy fatty acid monoester; polyoxyethylene polyoxypropylene block polymer; acetylene alcohol; acetylene glycol; acetylene alcohol derivatives such as polyethoxylate of acetylene alcohol; acetylene glycol derivatives such as polyethoxylate of acetylene glycol; fluorine-containing surfactants such as Fluorad (trade name, manufactured by 3M Japan Limited), Megafac (trade name, manufactured by DIC Corporation), Surufuron (trade name, manufactured by Asahi Glass Co., Ltd.); or organosiloxane surfactants, such as KP341 (trade name, manufactured by Shin-Etsu Chemical Co., Ltd.). Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid and the like.

Further, examples of the amphoteric surfactant include 2-alkyl-N-carboxymethyl-N-hydroxyethyl imidazolium betaine, lauric acid amide propyl hydroxysulfone betaine and the like.

These surfactants can be used alone or as a mixture of two or more kinds, and the mixing ratio thereof is usually 50 to 10,000 ppm, preferably 100 to 5,000 ppm, based on the total mass of the siliceous film manufacturing composition.

[Method of Manufacturing Siliceous Film]

A method of manufacturing a siliceous film of the present invention comprises applying the above-described siliceous film manufacturing composition on a substrate to form a coating and curing the coating under an oxidizing atmosphere.

The method for applying the siliceous film manufacturing composition to such a substrate is not limited in particular and includes usual methods for coating, for example, a spin coating, a dip coating, a spray coating, a transfer method, a roll coating, a bar coating, a doctor coating, a brush coating, a flow coating, or a slit coating, and the like. A suitable substrate, on which the siliceous film manufacturing composition is applied, such as a silicon substrate, a glass substrate and a resin film can be used. Semiconductor elements and the like can be formed on these substrates as necessary.

After applying the siliceous film manufacturing composition, for the purposes of drying or preliminary curing of the coating film, a prebaking step is preferably carried out. The prebaking step is carried out in the atmosphere, an inert gas or oxygen gas under the processing conditions, such as at from 50 to 400° C. for 10 seconds to 30 minutes on a hotplate or for 1 to 30 minutes in an oven. The prebaking step is preferably carried out in nitrogen atmosphere.

According to the present invention, the prebaked film is heated under an oxidizing atmosphere. The prebaked film is converted into a siliceous film by heating.

In the present specification, siliceous film means a film comprising oxygen atom and silicon atom, in which the ratio of oxygen atom to silicon atom (O/Si) is 1.20-2.50, preferably 1.40-2.50 and more preferably 1.60-2.45. The siliceous film can contain other atoms such as hydrogen, nitrogen and carbon.

Oxidizing atmosphere is an atmosphere which oxygen partial pressure is 20-101 kPa, preferably 40-101 kPa and more preferably containing water vapor partial pressure of 1.5-80 kPa, when total pressure is 101 kPa.

It is preferable to heat under an atmosphere containing water vapor. The atmosphere containing water vapor means the atmosphere, in which the water vapor partial pressure is within a range from 0.5 to 101 kPa, preferably from 1 to 90 kPa, more preferably 1.5 to 80 kPa. Heating can be carried out within a temperature range from 200 to 1000° C.

Incidentally, there are sometimes concerns that the heating in an atmosphere containing water vapor at an elevated temperature, for example, at a temperature exceeding 600° C. affects other element such as an electronic device, which is simultaneously exposed to the heating treatment. In such a case, the silica-converting step can be divided into three or more stages. The heating can be carried out first in an oxidizing atmosphere at low temperature, for example, 200-400° C., second in an atmosphere containing water vapor at a relatively low temperature, for example, 300-600° C., and subsequently in an atmosphere containing no water vapor at a higher temperature, for example, 500-1000° C.

Other components than water vapor in the atmosphere containing water vapor (hereinafter referred to as "dilution gas") can be any gas, and specific examples thereof are air, oxygen, nitrogen, nitrous oxide, ozone, helium, argon, and the like. In terms of quality of the obtained siliceous material, it is preferred to use oxygen as the dilution gas. However, the dilution gas is properly selected considering also the influence onto other elements such as electronic devices, which are exposed to the heating treatment. As the atmosphere containing no water vapor in the above-described three-stage heating method, the atmosphere containing any of the above dilution gas such as nitrogen as well as a pressure-reduced atmosphere of less than 1.0 kPa or a vacuum atmosphere can be adopted.

The heating rate to the target temperature and the cooling rate during the heating are not particularly limited and can be generally within a range from 1° C. to 100° C./min. In addition, holding time after reaching the target temperature is not also limited in particular, and it can be generally within a range from 1 minute to 10 hours.

After applying the siliceous film manufacturing composition on a substrate and prior to a prebake step, photoirradiation can be conducted on a coating. Reduction of film thickness of the coating during the curing step can be suppressed by the photoirradiation on the coating. Preferable irradiation wavelength is 248-436 nm, more preferably 282-405 nm. Irradiation intensity is preferably 10-700 mW/cm$^2$, more preferably 40-500 mW/cm$^2$. Irradiation time is preferably 30-3,000 seconds, more preferably 50-2,500 seconds.

Film thickness of the derived siliceous film is not specifically limited but preferably 1-10 μm, more preferably 1-8 μm.

Method for manufacturing an electronic device of the present invention comprises the above described method. Preferably the device is a semiconductor device, solar cell chip, organic light emitting diode and inorganic light emitting diode. One preferable embodiment of the device of this invention is a semiconductor device.

EXAMPLES

Hereinafter, the present invention will be described with working examples. These examples are given only for illustrative purpose and not intended to limit the scope of the present invention.

Synthesis Example 1: Polycarbosilane (A)

390 g of metallic sodium was heated to 100° C.-120° C. in 2.5 L of xylene under a nitrogen stream, stirred, and melted. 1,100 g of dichlorodimethylsilane was added dropwise thereto, and the mixture was stirred under reflux at 120 to 140° C. for 12 hours. As a result, a purple precipitate was obtained. After xylene was filtered off, methanol was added to this precipitate, the mixture was stirred, and a treatment to inactivate residual metallic sodium was carried out. Further, 3 L of pure water was added, and stirring and filtration were repeated twelve times to remove by-product sodium chloride. The product was dried in a vacuum drier at 90° C. and 5 mmHg, for 24 hours to obtain 420 g of white powdery polydimethylsilane.

300 g of the polydimethylsilane obtained above was placed in a porcelain crucible and set it in a pressurization atmospheric furnace. After replacing the air with nitrogen gas, pressurized reaction at 750° C. under 0.5 MPa for 12 hours was carried out. 210 g (yield: 70%) of a pressurized reaction product was obtained. This pressurized reaction product was dissolved in 500 mL of n-hexane and filtered. The resulting solution was added dropwise to 1,000 mL of ethanol being stirred. The precipitate was filtered off and the solvent was distilled off under reduced pressure to obtain 96 g of a pale-yellow solid. The yield was 32% based on polydimethylsilane. Mass average molecular weight was 1870.

Synthesis Example 2: Polycarbosilane (B)

15 g of magnesium powder, which was ground in nitrogen atmosphere, and 500 mL of dry diethyl ether were placed in a 2 L four necked flask equipped with a reflux condenser, a mechanical stirrer, a 1000 mL dropping funnel, and a nitrogen inlet. 184 g chloromethyltrichlorosilane was dissolved in 500 mL of dry diethyl ether and placed in the 1000 mL dropping funnel. Chloromethyltrichlorosilane solution was added to the magnesium powder suspension dropwise with vigorous stirring. After the addition was completed, the mixture was heated at 50° C. with an oil bath and kept stirred under nitrogen flow for 72 hours. The mixture was filtered in a nitrogen atmosphere to separate solids. Solvent of the filtrate was removed over a rotary evaporator and 52 g of brown viscous liquid was obtained. The brown viscous liquid was a poly(chlorocarbosilane) from measurements of FT-IR, $^1$H NMR and $^{29}$Si NMR.

50 g of poly(chlorocarbosilane) was dissolved in 500 mL of dry diethyl ether and placed in a 2 L four necked flask equipped with a reflux condenser, a mechanical stirrer, a 500 mL dropping funnel, and a nitrogen inlet. 12.3 g of LiAlH$_4$ was dissolved in 200 mL of dry diethyl ether and placed in the 500 mL dropping funnel. The poly(chlorocarbosilane) solution was cooled with an ice bath. The LiAlH$_4$ solution was added to the poly(chlorocarbosilane) solution dropwise for about 1 hour. After the addition was completed, the mixture was heated with an oil bath and refluxed under nitrogen flow for 12 hours.

1 L of 3 mol/L HCl aqueous solution was added to the mixture with vigorous stirring. The diethyl ether layer was separated and washed with pure water. Solvent of the solution was removed over a rotary evaporator and 42 g of pale-yellow viscous liquid was obtained. The product was a poly(perhydrocarbosilane) from measurements of FT-IR, $^1$H NMR and $^{29}$Si NMR. Mass average molecular weight was 950.

Synthesis of a block copolymer and preparation of a composition in the following examples and comparative examples were conducted in a globe box which oxygen concentration is controlled 1.0 ppm or less and dew point is controlled −76.0° C. or less.

Example 1

0.35 g (2.03 mmol) of hexacyclosilane was placed in a 6 mL glass bottle with a stirrer tip. Hexacyclosilane was irradiated during stirring with ultraviolet ray having wavelength of 365 nm, which is generated from a mercury xenon lamp. Irradiation intensity was 82 mW/cm$^2$ for 120 seconds. 1.45 g of 50 mass % toluene solution of Polycarbosilane (A) (12.5 mmol) and 0.15 g (1.13 mmol) of trichlorosilane as a cross-linker were added to the ultraviolet ray irradiated hexacyclosilane. The mixture was irradiated during stirring with ultraviolet ray having wavelength of 365 nm, which was generated from a mercury xenon lamp, for 60 minutes. The product was diluted with toluene to obtain 25 mass % solution. The solution was filtered through 5.0 μm pore size PTFE filter and subsequently 0.2 μm pore size PTFE filter to remove by-products and siliceous film manufacturing composition A was obtained. A ratio of total number of repeating units of polysilane to total number of repeating units of polycarbosilane was 90% from $^{29}$Si-NMR measurement. Mass average molecular weight was 2,460.

The siliceous film manufacturing composition A was spin-coated on a silicon wafer by using 1HDX2 (Mikasa Co. Ltd.). The coating was irradiated with visible light having wavelength of 405 nm at irradiation intensity of 50 mW/cm$^2$. The irradiated coating was prebaked at 150° C. for 1 minute on a hotplate under nitrogen atmosphere. The prebaked film was cured at 250° C. for 30 minutes under oxygen atmosphere (101 kPa) and subsequently at 350° C. for 120 minutes under water vapor (40 kPa) containing atmosphere. The cured film was annealed at 950° C. for 30 minutes to obtain a siliceous film. The ratio of oxygen atom to silicon atom (0/Si) and the ratio of carbon atom to silicon atom (C/Si) were measured by Secondary Ion Mass Spectrometry (SIMS). 0/Si was 1.80 and C/Si was 0.12.

Example 2

0.40 g (2.20 mmol) of hexacyclosilane was placed in a 20 mL glass bottle with a stirrer tip. Hexacyclosilane was irradiated during stirring with ultraviolet ray having wavelength of 254 nm, which is generated from a low-pressure mercury lamp. Irradiation intensity was 12 mW/cm2 for 150 seconds. 7.02 g of 50 mass % toluene solution of Polycarbosilane (B) (60.5 mmol) and 0.15 g (1.13 mmol) of trichlorosilane as a cross-linker were added to the ultraviolet irradiated hexacyclosilane. The mixture was irradiated with ultraviolet ray having wavelength of 254 nm, which is generated from a low-pressure mercury lamp for 60 minutes. The product was diluted with toluene to obtain 25 mass % solution. The solution was filtered through 5.0 μm pore size PTFE filter and subsequently 0.2 μm pore size PTFE filter to remove by-products and siliceous film manufacturing composition B was obtained. A ratio of total number of repeating units of polysilane to total number of repeating units of polycarbosilane was 25% from $^{29}$Si-NMR measurement. Mass average molecular weight was 1,520.

The siliceous film manufacturing composition B was spin-coated on a silicon wafer by using 1HDX2 (Mikasa Co. Ltd.). The coating was irradiated light having wavelength of 405 nm at irradiation intensity of 50 mW/cm2. The irradiated coating was prebaked at 150° C. for 1 minute on a hotplate under nitrogen atmosphere. The prebaked film was cured at 250° C. for 30 minutes under oxygen atmosphere (101 kPa) and subsequently at 350° C. for 120 minutes under water vapor (40 kPa) containing atmosphere. The cured film was annealed at 950° C. for 30 minutes to obtain a siliceous film. The ratio of oxygen atom to silicon atom (0/Si) and the ratio of carbon atom to silicon atom (C/Si) were measured by Secondary Ion Mass Spectrometry (SIMS). 0/Si was 1.80 and C/Si was 0.12.

Example 3

0.68 g (3.80 mmol) of hexacyclosilane was placed in a 20 mL glass bottle with a stirrer tip. Hexacyclosilane was irradiated during stirring with ultraviolet ray having wavelength of 254 nm, which is generated from a low-pressure mercury lamp. Irradiation intensity was 12 mW/cm2 for 180 seconds. 1.47 g of 50 mass % toluene solution of Polycarbosilane (B) (12.7 mmol) and 0.32 g (1.20 mmol) of hexachlorodisilane as a cross-linker were added to the ultraviolet irradiated hexacyclosilane. The mixture was irradiated with ultraviolet ray having wavelength of 254 nm, which is generated from a low-pressure mercury lamp for 60 minutes. The product was diluted with toluene to obtain 25 mass % solution. The solution was filtered through 5.0 μm pore size PTFE filter and subsequently 0.2 μm pore size PTFE filter to remove by-products and siliceous film manufacturing composition C was obtained. A ratio of total number of repeating units of polysilane to total number of repeating units of polycarbosilane was 170% from $^{29}$Si-NMR measurement. Mass average molecular weight was 2,440.

A siliceous film was manufactured by using composition C from the procedure described in Example 2. O/Si was 1.93 and C/Si was 0.06.

Comparative Example 1

0.52 g (2.89 mmol) of hexacyclosilane was placed in a 6 mL glass bottle with a stirrer tip. Hexacyclosilane was irradiated during stirring with ultraviolet ray having wavelength of 365 nm, which is generated from a mercury xenon lamp. Irradiation intensity was 82 mW/cm2 for 120 seconds. The irradiated hexacyclosilane was diluted with toluene to obtain 25 mass % solution. The solution was further irradiated during stirring with ultraviolet ray having wavelength of 365 nm, which was generated from a mercury xenon lamp, for 60 minutes. Subsequently, the solution was filtered through 5.0 μm pore size PTFE filter and subsequently 0.2 μm pore size PTFE filter to remove by-products and siliceous film manufacturing composition D was obtained. Mass average molecular weight was 760.

The composition D was spin-coated on a silicon wafer by using 1HDX2 (Mikasa Co. Ltd.). However, to form a coating was unsuccessful due to low adhesion to the wafer.

Comparative Example 2

Polycarbosilane (A) was diluted with toluene to obtain 25 mass % solution. The solution was filtered through 5.0 μm pore size PTFE filter and subsequently 0.2 μm pore size PTFE filter to remove impurities and siliceous film manufacturing composition E was obtained. A siliceous film was manufactured by using composition E from the procedure described in Example 1.

[Filling Property]

A siliceous film manufacturing composition was coated at 1000 rpm using a spin coater 1HDX2 (Mikasa Co. Ltd.) on a silicon wafer. The silicon wafer had a rectangular vertical section and a trench of 1000 nm depth and 10 nm width. Curing procedure was conducted as described above and a siliceous film coated silicon wafer was obtained. A trench pattern portion was cut perpendicular to the trench direction, and the wafer sample was observed on an electron scanning microscope. There was no void in the trench which siliceous film was derived from Example 1-3. Example 1-3 showed good filling properties.

[Film Thickness]

Film thickness of a siliceous film was measured by a reflection spectroscopic film thickness meter FE-3000 (Otsuka Electronics Co., Ltd.) when the film thickness was 2 μm or less. When the film thickness exceeded 2 μm, a part of the siliceous film was removed with hydrofluoric acid solution and the film thickness was measured by a surface roughness meter Surfcom Touch 550 (Tokyo Seimitsu Co., Ltd.).

[Refractive Index]

Refractive index of a siliceous film was measured at 633 nm by a spectroscopic ellipsometer M-44 (J.A. Woollam Co., Inc.).

ELECTRICAL PROPERTIES

Breakdown electric field and relative dielectric constant were measured on a siliceous film which film thickness was adjusted to 0.3 μm. Relative dielectric constant was measured by a mercury probe equipment MCV-530 (Semilab Inc.). Breakdown electric field was measured by SSM495 272A-M100 (Japan SSM Co., Ltd.). An electric field which current density exceeded 1E-6 (A/cm2) was defined as breakdown electric field Fbd (MV/cm). Results are described in Table 1.

TABLE 1

| | Film thickness (μm) | Refractive index | Relative dielectric constant | Fbd (MV/cm) |
|---|---|---|---|---|
| Example 1 | 5.1 | 1.516 | 2.75 | 2.96 |
| Example 2 | 3.2 | 1.512 | 2.80 | 3.16 |
| Example 3 | 6.0 | 1.510 | 2.92 | 3.24 |
| Comparative example 1 | | Film was not available | | |
| Comparative example 2 | 0.8 | 1.582 | 2.70 | 0.36 |

The invention claimed is:

1. A siliceous film manufacturing composition comprising, (a) a block copolymer having a linear and/or cyclic polysilane backbone Block A with 5 or more silicon atoms and a polycarbosilane backbone Block B with 15 or more silicon atoms, wherein at least one silicon atom of Block A is bound to at least one silicon atom of Block B with a single bond and/or a cross-linker containing silicon atom, and (b) a solvent.

2. The siliceous film manufacturing composition according to claim 1, wherein Block A comprises 5 or more repeating units selected from at least one of the groups consisting of units represented by the following formulae (I-1) to (I-3), and Block B comprises 15 or more repeating units selected from at least one of the groups consisting of units represented by the following formulae (II-1) to (II-4).

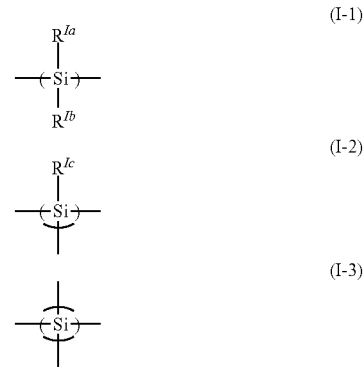

in which
each $R^{Ia}$, $R^{Ib}$ and $R^{Ic}$ is independently hydrogen, halogen, $C_1$-$C_6$ alkyl, or $C_6$-$C_{10}$ aryl,

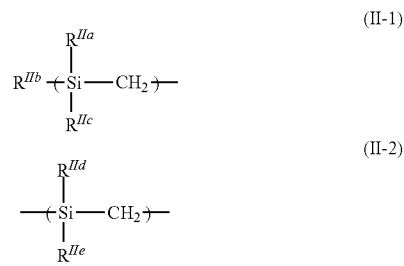

-continued

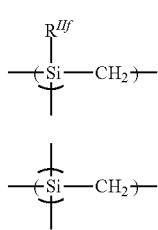

(II-3)

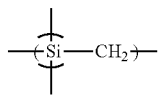

(II-4)

in which
each $R^{IIa}$-$R^{IIf}$ is independently hydrogen, $C_1$-$C_6$ alkyl, or $C_6$-$C_{10}$ aryl.

3. The siliceous film manufacturing composition according to claim 1, wherein the mass average molecular weight of the block copolymer is 1,200 to 25,000.

4. The siliceous film manufacturing composition according to claim 1, wherein a ratio of total number of repeating units of Block A to total number of repeating units of Block B is 20-230%.

5. The siliceous film manufacturing composition according to claim 1, wherein at least one of $R^{Ia}$, $R^{Ib}$ and $R^{Ic}$ of Block A is a single bond and the remaining is hydrogen.

6. The siliceous film manufacturing composition according to claim 1, wherein at least one of $R^{IIa}$-$R^{IIf}$ of Block B is a single bond and the remaining is hydrogen.

7. The siliceous film manufacturing composition according to claim 1, wherein the block copolymer constituted by a main chain comprising Block B and a side chain comprising Block A.

8. The siliceous film manufacturing composition according to claim 1, wherein at least one of Block A is (I-4).

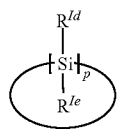

(I-4)

in which
each $R^{Id}$ and $R^{Ie}$ is independently hydrogen, halogen, $C_1$-$C_6$ alkyl, $C_6$-$C_{10}$ aryl, or a single bond, provided that at least one of $R^{Id}$ or $R^{Ie}$ is a single bond, p is an integer of 5 or more.

9. The siliceous film manufacturing composition according to claim 1, wherein the block copolymer comprising Block A bound to another Block A, Block B bound to another Block B, and/or Block A bound to Block B with a cross-linker containing silicon atom.

10. The siliceous film manufacturing composition according to claim 1, wherein the solvent having a relative dielectric constant of 3.0 or less.

11. A method for manufacturing a siliceous film comprising;
applying the siliceous film manufacturing composition according to claim 1 on a substrate to form a coating, and
curing the coating under an oxidizing atmosphere.

12. The method according to claim 11, wherein the oxidizing atmosphere is oxygen partial pressure of 20-101 kPa and/or water vapor partial pressure of 0.5-101 kPa.

13. The method according to claim 11, further comprises photoirradiation with wavelength of 245-438 nm on the coating prior to the curing.

14. The method according to any one of claim 11, wherein the curing is carried out at 200-1000° C.

15. A siliceous film obtainable by the method for manufacturing a siliceous film according to claim 11.

16. A method for manufacturing an electronic device comprising the method for manufacturing the siliceous film according to claim 11.

* * * * *